US006965269B2

(12) United States Patent
Takasu

(10) Patent No.: US 6,965,269 B2
(45) Date of Patent: Nov. 15, 2005

(54) MICROWAVE PHASE SHIFTER HAVING AN ACTIVE LAYER UNDER THE PHASE SHIFTING LINE AND POWER AMPLIFIER USING SUCH A PHASE SHIFTER

(75) Inventor: Hideki Takasu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/634,887

(22) Filed: Aug. 6, 2003

(65) Prior Publication Data

US 2004/0041664 A1 Mar. 4, 2004

Related U.S. Application Data

(63) Continuation of application No. PCT/JP03/00852, filed on Jan. 29, 2003.

(30) Foreign Application Priority Data

Jan. 31, 2002 (JP) ............................ 2002-023487

(51) Int. Cl.$^{7}$ ............................ H01P 1/18; H03F 3/68
(52) U.S. Cl. ...................................... 330/295; 333/164
(58) Field of Search ................................ 333/161, 164, 333/156; 330/295

(56) References Cited

U.S. PATENT DOCUMENTS 3,560,891 A * 2/1971 MacLeay et al. ........... 333/161
4,630,011 A * 12/1986 Neidert et al. .............. 333/164
5,083,100 A * 1/1992 Hawkins et al. ............ 333/164
5,576,671 A * 11/1996 Agar et al. ................. 333/128
5,777,531 A * 7/1998 Tran et al. .................. 333/164

FOREIGN PATENT DOCUMENTS

| | | |
|---|---|---|
| JP | 2-241103 | 9/1990 |
| JP | 8-8660 | 1/1996 |
| JP | 11-176989 | 7/1999 |
| JP | 2001-119204 | 4/2001 |

* cited by examiner

*Primary Examiner*—Benny Lee
(74) *Attorney, Agent, or Firm*—Oblon, Spivak, McClelland, Maier & Neustadt, P.C.

(57) ABSTRACT

A phase shifter according to this invention includes a circuit board having a semi-insulating layer. An active layer is formed in a transmission line forming portion on one surface side of the semi-insulating layer, a first ground conductive layer is formed on the other surface side, a transmission line is formed on the upper side of the active layer, and a second ground conductive layer is formed on the transmission line forming surface of the semi-insulating layer in close proximity to one side of the transmission line. If a bias voltage of negative polarity is applied to the transmission line, reverse bias is applied to the active layer to form a depletion layer and capacitance is equivalently connected to the transmission line having inductance. A phase shift amount can be freely controlled by changing the value of the capacitance according to the bias voltage.

6 Claims, 3 Drawing Sheets

MICROWAVE PHASE SHIFTER HAVING AN ACTIVE LAYER UNDER THE PHASE SHIFTING LINE AND POWER AMPLIFIER USING SUCH A PHASE SHIFTER

CROSS-REFERENCE TO RELATED APPLICATIONS

This is a Continuation Application of PCT Application No. PCT/JP03/00852, filed Jan. 29, 2003, which was not published under PCT Article 21(2) in English.

This application is based upon and claims the benefit of priority from the prior Japanese Patent Application No. 2002-023487, filed Jan. 31, 2002, the entire contents of which are incorporated herein by reference.

BACKGROUND OF THE INVENTION

1. Field of the Invention

The present invention relates to a microwave phase shifter which gives a desired phase shift amount to a high-frequency signal and a power amplifier using the microwave phase shifter.

2. Description of the Related Art

A microwave phase shifter is a circuit which gives a preset phase shift amount to a high-frequency signal of microwave, millimeter wave or the like and is normally configured by combining several transmission lines, a switch circuit and the like. For example, it has a transmission line used as a reference and transmission lines having delay amounts corresponding to preset phase differences with respect to the reference side transmission line, and a phase shift amount corresponding to the phase difference with respect to the reference is acquired by selecting one of the transmission lines by use of the switch circuit.

The microwave phase shifter with the above configuration is formed in an IC form by forming a plurality of transmission lines with different delay amounts and a switch circuit to switch the transmission lines on a substrate and thus an attempt is made to make the whole device small. However, since the switch circuit simultaneously makes selection of and switching to a single line from a plurality of lines on the input side and output side, a plurality of switch elements and driving control circuits are required. As a result, the circuit configuration of the microwave phase shifter formed on the substrate becomes complicated, the substrate becomes larger and the cost rises due to an increase in the number of manufacturing steps.

In the latest microwave communications devices for satellite communications, mobile communications, etc, a power amplifier using a semiconductor amplifier element is used, from the viewpoint of size, weight, reliability, etc. In a power amplifier using this semiconductor amplifier element, the output power which can be acquired by use of one element is not necessarily sufficient. Therefore, a power synthesizing type of power amplifier is proposed which, when a high output power is required, distributes an input signal into plural paths, amplifies them by use of semiconductor amplifier elements while controlling the signal phases, and then re-synthesizes the signals (for example, Jpn. Pat. Apln. KOKAI Publication No. 2001-196870 (p 5, FIG. 1)).

In the power amplifier, since a power loss occurs if the phases of the signals are deviated at the time of power synthesis, the phase differences between the signals are eliminated and the loss at the time of power synthesis is reduced by inserting phase shifters into paths other than a path used as a reference to adjust the phases. Thus, in the power synthesizing type of power amplifier, phase shifters corresponding in number to (the number of distributions—1) are required. Therefore, in order to make the power amplifier small and sufficiently reduce the loss, a phase shifter which is small and inexpensive and can relatively easily and precisely adjust the phase shift amount is desired.

SUMMARY OF THE INVENTION

An object of this invention is to provide a microwave phase shifter in which the circuit configuration is simple and can be easily made small, and as a result, the manufacturing cost can be lowered, and which can relatively easily and precisely adjust a phase shift amount, and a power synthesizing type of power amplifier using the microwave phase shifter.

A microwave phase shifter of this invention comprises a semi-insulating substrate having an operating layer partly formed thereon, a signal conductor formed on the operating layer of the semi-insulating substrate, a grounding conductor formed on the same surface as the signal conductor on the semi-insulating substrate, and a bias power supply which applies a bias voltage to the signal conductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

There will now be described embodiments of this invention with reference to the accompanying drawings.

(First Embodiment)

Figure 1:
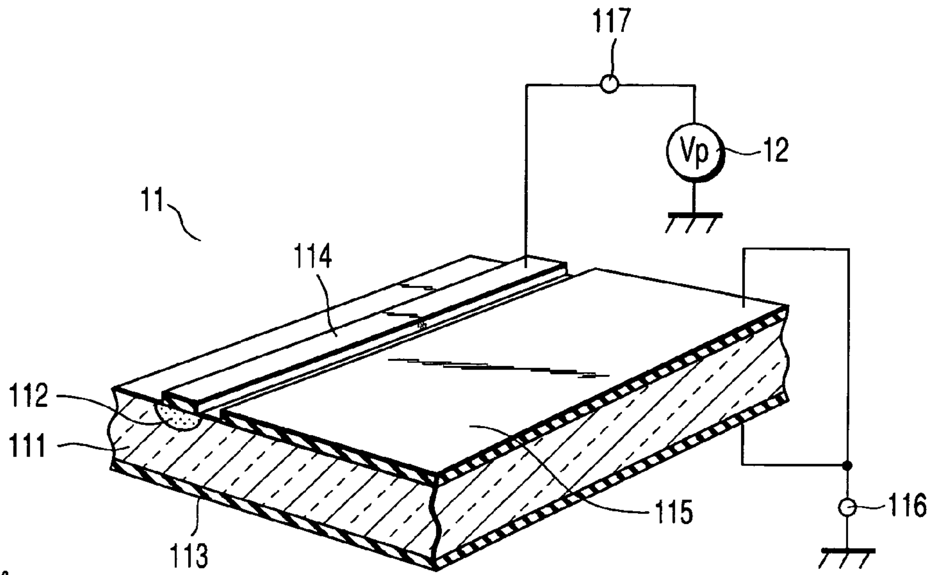
FIG. 1 is a configuration view showing the configuration of a microwave phase shifter according to a first embodiment of this invention.

FIG. 1 is a configuration view showing the configuration of a microwave phase shifter according to a first embodiment of this invention. In FIG. 1, reference label 11 denotes a circuit board of the microwave phase shifter. The circuit board 11 is a semi-insulating substrate having a semi-insulating layer 111 formed of a semi-insulating material such as GaAs. On one surface side (front surface side of the substrate) of the semi-insulating layer 111, an active layer 112 is formed in at least a transmission line forming portion, and on the other surface side (rear surface side of the substrate), a first conductive layer 113 of a metal material is formed. The active layer 112 is formed by ion-implanting an impurity into the semi-insulating layer 111, for example.

On the upper side of the active layer 112, a transmission line 114 of a metal material is formed. Further, on the surface of the semi-insulating layer 111 on which the transmission line 114 is formed, a second conductive layer 115 having an end portion formed to extend along and in close proximity to one side (right side in the drawing) of the transmission line 114 is formed.

In the circuit board 11 with the above configuration, the first conductive layer 113 and second conductive layer 115 are connected to a ground terminal 116 (the first conductive layer and second conductive layer are hereinafter referred to as a first grounding conductive layer and second grounding conductive layer, respectively), and the transmission line 114 is connected to a bias voltage input terminal 117. To the terminal 117, bias voltage Vp of negative polarity is applied from a bias power supply 12 on the external portion of the phase shifter. In this case, reverse bias is applied to the active layer 112 which lies directly under the transmission line 114. As a result, a depletion layer is formed in the active layer 112 and capacitance is equivalently connected to the transmission line 114. Further, if the value of the bias voltage is changed, the extent of the depletion layer varies. Therefore, the capacitance value caused by forming the depletion layer varies based on the function of the bias voltage.

Figure 2:
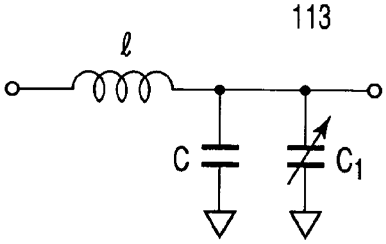
FIG. 2 is a circuit diagram showing the equivalent circuit of the first embodiment.

FIG. 2 is a circuit diagram showing the equivalent circuit of the microwave phase shifter with the above configuration for unit length. The transmission line 114 and the first and second grounding conductive layers 113, 115 formed on the front surface and rear surface of the semi-insulating layer 111 configure a micro-coplanar strip line utilizing the proximity effect. As shown in FIG. 2, the configuration can be expressed by an equivalent circuit configured by inductors and capacitors. In FIG. 2, reference label 1 indicates inductance of the transmission line 114 per unit length, reference label c indicates parasitic capacitance caused between the transmission line 114 and the first and second grounding conductive layers 113, 115, and reference label c1 indicates a capacitance caused by formation of the depletion layer. As is clearly seen from FIG. 2, the capacitance c1 caused by the depletion layer is formed in parallel with the parasitic capacitance c.

In this case, the characteristic impedence Z0 of the micro-coplanar strip line is determined by the equation (1).

$$Z0=[l/(c+c1)]^{1/2} \quad (1)$$

Therefore, the phase θ of a microwave signal (angular frequency ω) which propagates along the transmission line 114 with line length L is given by the equation (2) if $\beta=\omega\cdot Z0$.

$$\theta=\beta L=\omega[l/(c+c1)]^{1/2}\times L \quad (2)$$

As described before, the value of the capacitance c1 varies if the bias voltage Vp applied to the transmission line 114 is changed. Therefore, as is clearly seen from the equation (2), it becomes possible to change the propagation phase θ of the transmission line 114 by changing the bias voltage Vp.

For example, if a reference phase (θ1) is obtained when the bias voltage Vp is 0 [V] and a phase is set to θ2 when the bias voltage Vp is v, phase difference Δθ indicated by the equation (3) can be obtained.

$$\Delta\theta=\theta2-\theta1 \quad (3)$$

In this case, it is operated as a phase shifter with the phase shift amount Δθ.

From the above description, according to the configuration of the present embodiment, since a switch circuit to switch transmission lines becomes unnecessary and the phase shift amount can be set only by the bias voltage applied to the transmission line, the circuit configuration is made simple. Further, since the phase difference Δθ is determined by the value of the bias voltage Vp, the phase shift amount can be controlled in a continuous or stepwise fashion by changing the bias voltage in a continuous or stepwise fashion.

(Second Embodiment)

Figure 3:
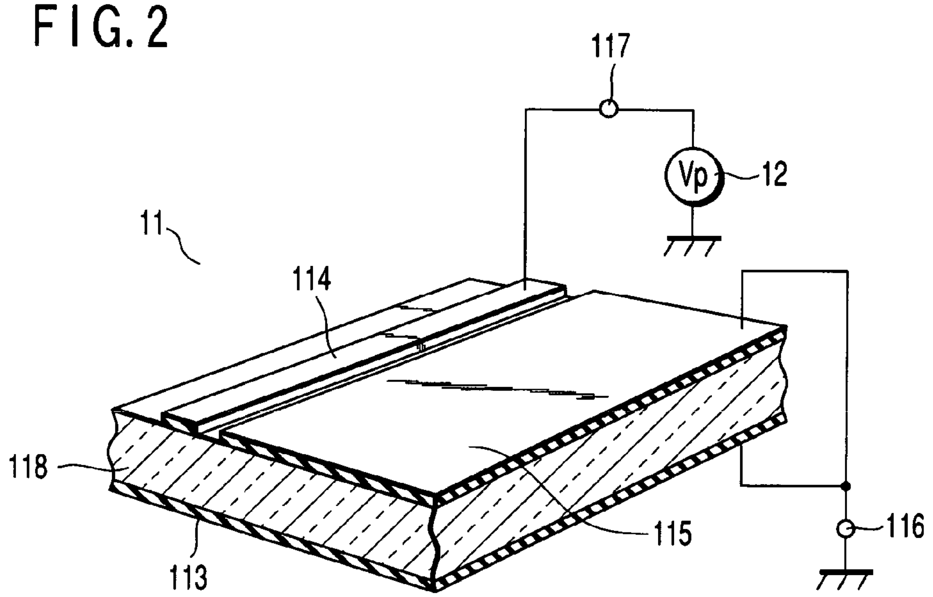
FIG. 3 is a configuration view showing the configuration of a microwave phase shifter according to a second embodiment of this invention.

FIG. 3 is a configuration view showing the configuration of a microwave phase shifter according to a second embodiment of this invention. In FIG. 3, the same portions as those of FIG. 1 are denoted by the same reference symbols and different portions are taken up and explained here.

A circuit board 11 shown in FIG. 3 includes a liquid crystal dielectric layer 118 instead of the semi-insulating layer of FIG. 1. Like the first embodiment, a transmission line 114 and first and second grounding conductive layers 113, 115 formed on the front surface and rear surface of the liquid crystal dielectric layer 118 configure a micro-coplanar strip line utilizing the proximity effect.

However, in the present embodiment, no active layer is formed.

With the above configuration, if bias voltage Vp is applied to the transmission line 114, voltages are applied to the liquid crystal dielectric layer 118 between the transmission line 114 and the first grounding conductive layer 113 and between the transmission line 114 and the second grounding conductive layer 115. As a result, in the liquid crystal dielectric layer 118, the directivity of an anisotropic dielectric is changed. The directivity is changed according to the value of the bias voltage Vp. Therefore, if the value of the bias voltage Vp is changed, values of parasitic capacitances caused between the transmission line 114 and the first grounding conductive layer 113 and between the transmission line 114 and the second grounding conductive layer 115 vary.

Figure 4:
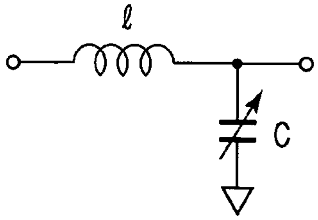
FIG. 4 is a circuit diagram showing the equivalent circuit of the second embodiment.

FIG. 4 is a circuit diagram showing the equivalent circuit of the microwave phase shifter with the above configuration for unit length. In FIG. 4, reference label 1 indicates an inductance of the transmission line 114 per unit length and reference label c indicates parasitic capacitance caused between the transmission line 114 and the first and second grounding conductive layers 113, 115. As clearly seen from FIG. 4, in the present embodiment, the capacitance caused by the depletion layer in the first embodiment is not present and the value of the parasitic capacitance c itself is changed.

In this case, the characteristic impedance Z0 of the micro-coplanar strip line is determined by the equation (4).

$$Z0=(l/c)^{1/2} \quad (4)$$

Therefore, the phase θ of a microwave signal (angular frequency ω) which propagates along the transmission line 114 with line length L is given by the equation (5) if $\beta=\omega\cdot Z0$.

$$\theta=\beta L=\omega(l/c)^{1/2}\times L \quad (5)$$

As described before, if the bias voltage Vp applied to the transmission line 114 is changed, the dielectric constant of the liquid crystal dielectric layer 116 varies and the value of the capacitance c varies. Therefore, as is clearly seen from the equation (5), it becomes possible to change the propagation phase θ of the transmission line 114 by changing the bias voltage Vp.

For example, if a reference phase (θ1) is obtained when the bias voltage Vp is 0 [V] and a phase is set to θ2 when the bias voltage Vp is v, phase difference Δθ indicated by the equation (6) can be obtained.

$$\Delta\theta = \theta 2 - \theta 1 \tag{6}$$

In this case, it is operated as a phase shifter with the phase shift amount Δθ.

From the above description, also, according to the configuration of the present embodiment, since a switch circuit to switch transmission lines becomes unnecessary and the phase shift amount can be set only by the bias voltage applied to the transmission line, the circuit configuration is made simple. Further, since the phase difference Δθ is determined by the value of the bias voltage Vp, the phase shift amount can be controlled in a continuous or stepwise fashion by changing the bias voltage in a continuous or stepwise fashion.

(Third Embodiment)

Figure 5:
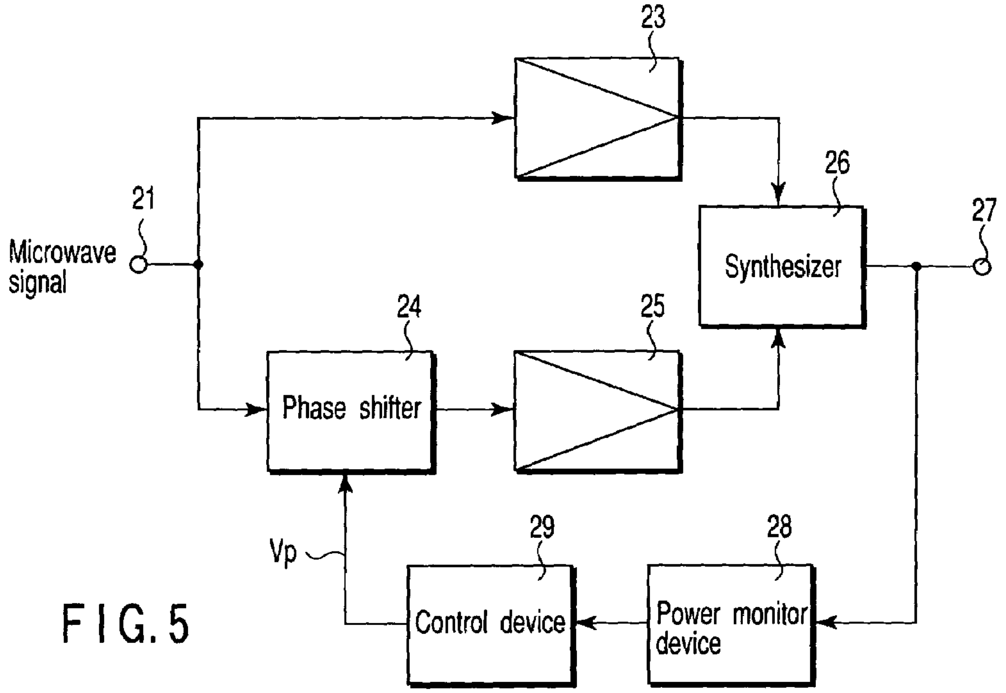
FIG. 5 is a block circuit diagram showing the configuration of a power amplifier according to a third embodiment of this invention.

FIG. 5 is a block circuit diagram showing the configuration of a power amplifier according to a third embodiment of this invention. In FIG. 5, a microwave transmission signal is supplied to an input terminal 21. The signal is distributed into two paths. One of the paths is used as a reference path and the distributed signal thereof is supplied to an amplifier 23 and power-amplified. The distributed signal of the other path is phase-adjusted by a phase shifter 24 so that the phase thereof will correspond to the signal of the reference path and is then supplied to an amplifier 25 and power-amplified. The distributed signals power-amplified by the respective amplifiers 23, 25 are synthesized in a synthesizer 26 and output from an output terminal 27.

The power amplifier of the above configuration is a so-called power synthesizing type, and it evenly matches the phases when power-amplifying the distributed microwave signals and adds and synthesizes the power-amplified outputs. In the present embodiment, as the phase shifter 24 to make a phase adjustment, the microwave phase shifter with the configuration of the first or second embodiment is used.

The power value of the synthesis signal supplied to the output terminal 26 is monitored by a power monitoring device 28 and the monitoring result is supplied to a control device 29. The control device 29 controls the phase shift amount of the phase shifter 24 so that the monitoring power value is maximum. The control is to supply the bias voltage Vp to a bias voltage input terminal of the phase shifter 24 and change the bias voltage Vp according to the phase shift amount.

Since the power amplifier with the above configuration uses the microwave phase shifter of the first or second embodiment in the phase shifter 24, it can be made small and the cost can be lowered. Further, since the phase shift amount of the phase shifter 24 can be adjusted continuously or in fine steps, it can be adjusted with high precision in comparison with the conventional line switching system.

Figure 6:
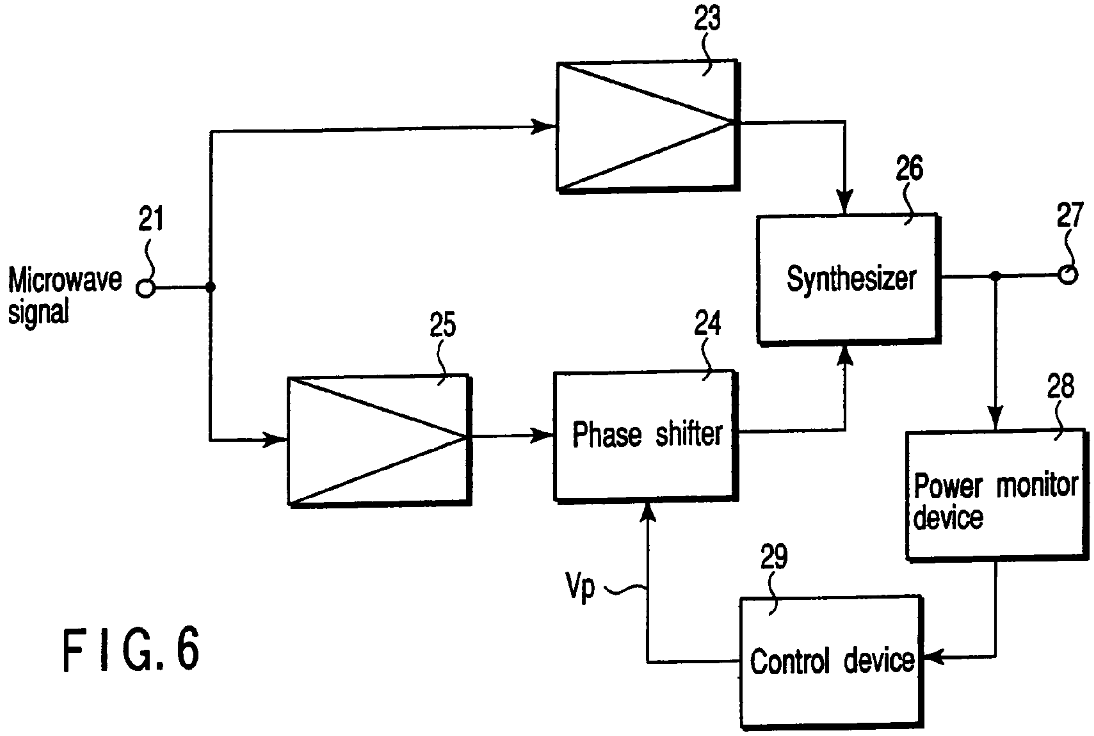
FIG. 6 is a block circuit diagram showing a modification of the power amplifier according to the third embodiment of this invention.

In the power amplifier of the above embodiment, the phase shifter 24 is incorporated in the preceding stage of the amplifier 25 in each distribution path, but since the configuration of the phase shifter of this invention is excellent in the power-resistance characteristic, it can be arranged in the succeeding stage of the amplifier 25 as shown in FIG. 6. In this case, since it becomes unnecessary to take the processing delay time of the amplifier 25 into consideration, phase matching with higher precision can be attained.

Further, in the above embodiment, the amplifier 25 and the phase shifter 24 are explained as different units, but the configuration of the phase shifter 24 can be incorporated into the amplifier 25 itself. With this configuration, the size can be further reduced.

Further, in the above embodiment, the number of distribution paths is two, but when the number of distribution paths is increased, the phases of transmission signals of the respective paths can be similarly matched by using one path as a reference path and arranging phase shifters in other paths. Of course, the same operation can be performed even when a phase shifter is arranged in the reference path.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A microwave phase shifter comprising:

a circuit board on which a transmission line configured to transmit a microwave signal is disposed on one surface of a semi-insulating layer;

a first conductive layer disposed on the other surface;

a second conductive layer disposed on a forming surface of the transmission line with an end portion set in close proximity to one side of the transmission line; and an active layer disposed under a forming portion of the transmission line in the semi-insulating layer; and a bias circuit configured to apply a bias voltage to the transmission line;

wherein the bias circuit grounds the first and second conductive layers and applies a bias voltage of negative polarity to the transmission line.

2. The microwave phase shifter according to claim 1, wherein the bias circuit variably controls the bias voltage in a continuous or stepwise fashion.

3. A power amplifier comprising:

a distributor configured to distribute a microwave signal to a plurality of transmission paths;

a plurality of amplifiers respectively provided in the plurality of transmission paths and configured to power-amplify the transmission signals;

a phase adjusting circuit configured to adjust signal propagation phases between the plurality of transmission paths by using at least one of the plurality of transmission paths as a reference path, providing respective phase shifters in all the other plurality of transmission paths and adjusting phase shift amounts of the respective phase shifters; and a synthesizer configured to synthesize the signals power-amplified by the plurality of amplifiers at ends of the plurality of transmission paths;

wherein each of the phase shifter includes a circuit board on which a respective transmission line configured to transmit a microwave signal is disposed on one surface of a corresponding semi-insulating layer, a respective first conductive layer is disposed on another surface, a second conductive layer is disposed on a forming surface of the corresponding transmission line with an end portion set in close proximity to one side of the corresponding transmission line, and a respective active layer is disposed under a forming portion of the corresponding transmission line in the corresponding semi-insulating layer, and a respective bias circuit applies a respective bias voltage to the respective transmission line; and wherein the respective bias circuit grounds the first and second conductive layers and applies the respective bias voltage of negative polarity to the corresponding transmission line shifter.

4. The power amplifier according to claim 3, wherein the respective bias voltage is variably controlled in a continuous or stepwise fashion.

5. The power amplifier according to claim 3, wherein the respective phase shifter is arranged on the output side of the corresponding power amplifier.

6. The power amplifier according to claim 3, wherein the phase adjusting circuit includes a monitor configured to monitor an output signal of the synthesizer and a control device configured to control a voltage value of the respective bias voltage based on the monitoring result of the monitor.

* * * * *